| 
US010504878B2

(12) United States Patent
Min et al.

(10) Patent No.: US 10,504,878 B2
(45) Date of Patent: Dec. 10, 2019

(54) LED MODULE ASSEMBLIES FOR DISPLAYS

(71) Applicant: LUMENS CO., LTD., Yongin-si, Gyeonggi-do (KR)

(72) Inventors: Chunki Min, Yongin-si (KR); Keunoh Kim, Yongin-si (KR); Huikyeong Noh, Yongin-si (KR); Kyungmin Cho, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 16/152,380

(22) Filed: Oct. 4, 2018

(65) Prior Publication Data
US 2019/0115329 A1  Apr. 18, 2019

(30) Foreign Application Priority Data
Oct. 12, 2017  (KR) .......................... 10-2017-0132603

(51) Int. Cl.
*H01L 25/13*       (2006.01)
*H01L 33/54*       (2010.01)
(Continued)

(52) U.S. Cl.
CPC .......... *H01L 25/13* (2013.01); *H01L 25/0753* (2013.01); *H01L 33/44* (2013.01); *H01L 33/54* (2013.01)

(58) Field of Classification Search
CPC .................................................. H01L 25/0753
See application file for complete search history.

(56) References Cited

U.S. PATENT DOCUMENTS

| 8,167,445 | B2* | 5/2012 | Lee ................... G02F 1/133603 362/612 |
| 9,341,888 | B2* | 5/2016 | Takeuchi .......... G02F 1/133603 |
| 2019/0057955 | A1* | 2/2019 | Moosburger ............. G09G 3/32 |

FOREIGN PATENT DOCUMENTS

| JP | 59-206869 A | 11/1984 |
| JP | 08-122769 A | 5/1996 |

(Continued)

*Primary Examiner* — Raj R Gupta
(74) *Attorney, Agent, or Firm* — Mei & Mark LLP

(57) ABSTRACT

Disclosed is an LED module assembly for a display including a first LED module and a second LED module. The first LED module includes a first unit substrate, a plurality of LED chips mounted on the first unit substrate to form a plurality of pixels, and a first light absorbing layer formed on the first unit substrate. The second LED module includes a second unit substrate, a plurality of LED chips mounted on the second unit substrate to form a plurality of pixels, and a second light absorbing layer formed on the second unit substrate. The first unit substrate and the second unit substrate are laterally connected to each other. Each of the first light absorbing layer and the second light absorbing layer includes a plurality of valleys formed between the plurality of pixels. The first light absorbing layer includes a first inclined portion formed obliquely from the upper end edge of the interface between the first unit substrate and the second unit substrate to the upper portion of the side surface of each of the outer LED chips mounted on the first unit substrate. The second light absorbing layer includes a second inclined portion formed obliquely from the upper end edge of the interface between the first unit substrate and the second unit substrate to the upper portion of the side surface of each of the outer LED chips mounted on the second unit substrate. At least one of the plurality of valleys is formed by the first inclined portion and the second inclined portion meeting each other.

14 Claims, 3 Drawing Sheets

(51) Int. Cl.
*H01L 33/44* (2010.01)
*H01L 25/075* (2006.01)

(56) References Cited

FOREIGN PATENT DOCUMENTS

| | | |
|---|---|---|
| JP | 08122769 A | 5/1996 |
| JP | 2002-118124 A | 4/2002 |
| JP | 2009-258455 A | 11/2009 |
| JP | 2011-075825 A | 4/2011 |
| JP | 2011-75825 A | 4/2011 |
| JP | 2016-224319 A | 12/2016 |

* cited by examiner

LED MODULE ASSEMBLIES FOR DISPLAYS

BACKGROUND OF THE INVENTION

1. Field of the Invention

The present invention relates to LED module assemblies, and more specifically to LED module assemblies including LED modules laterally connected to one another such that color interference or diffuse reflection of light at the seams between the LED modules is prevented, achieving a seamless display.

2. Description of the Related Art

Techniques are already known wherein a plurality of LED modules are laterally connected to one another to construct an LED module assembly. Such a conventional LED module assembly is applied to an LED display.

FIG. 1 illustrates a conventional LED module assembly including a plurality of LED modules 2 laterally connected to each other. As illustrated in FIG. 1, each of the plurality of LED modules 2 includes a unit substrate 22, a plurality of LED chips 24a, 24b, and 24c mounted on the unit substrate 22 to form a plurality of pixels, and a black molded part 26 formed on the unit substrate 22 to cover the upper and side surfaces of the plurality of LED chips 24a, 24b, and 24c. The black molded part 26 can be formed by a transfer molding process using a mixture of a resin material and black carbon. The black molded part 26 is provided for the purpose of reducing color interference of light emitted from the side surfaces of the R, G, and B LED chip to achieve a pure black display.

The plurality of LED modules 2 are singulated from a larger LED module structure. In each of the plurality of LED modules 2, the side surfaces of the unit substrate 22 and the black molded part 26 form cut surfaces. When a display using the LED module assembly is driven, the seam boundaries between the LED modules 2 are made clear, considerably deteriorating display quality, as shown in FIG. 2. This phenomenon causes diffuse reflection of light emitted from the plurality of LED modules at the cut surfaces of the black molded parts 26 formed by a cutting process such as sawing. Transfer molding for the formation of the black molded parts 26 requires free spaces for mold pressing. Further, the black molded parts 26 covering the upper portions of the LED chips decrease the amount of light emitted from the LED chips, resulting in poor efficiency. Alternatively, squeezing may be applied to the formation of the black molded parts 26. However, this process is limited in that it is difficult to maintain the height variation and flatness of the black molded parts.

Further, if the intervals between the seam boundaries created when the cut surfaces are bonded are larger than the intervals between the plurality of LEDs, the seam boundaries look like lines.

SUMMARY OF THE INVENTION

The present invention has been made in view of the above problems, and it is an object of the present invention to provide LED module assemblies including LED modules laterally connected to one another wherein color interference or diffuse reflection of light at the seams between the LED modules is prevented and the intervals between the seam boundaries are made as small as the intervals between a plurality of pixels, achieving a seamless display.

An LED module assembly for a display according to one aspect of the present invention includes a first LED module and a second LED module wherein the first LED module includes a first unit substrate, a plurality of LED chips mounted on the first unit substrate to form a plurality of pixels, and a first light absorbing layer formed on the first unit substrate; the second LED module includes a second unit substrate, a plurality of LED chips mounted on the second unit substrate to form a plurality of pixels, and a second light absorbing layer formed on the second unit substrate; the first unit substrate and the second unit substrate are laterally connected to each other; each of the first light absorbing layer and the second light absorbing layer includes a plurality of valleys formed between the plurality of pixels; the first light absorbing layer includes a first inclined portion formed obliquely from the vicinity of the upper end edge of the interface between the first unit substrate and the second unit substrate to the upper portion of the side surface of each of the outer LED chips mounted on the first unit substrate; the second light absorbing layer includes a second inclined portion formed obliquely from the vicinity of the upper end edge of the interface between the first unit substrate and the second unit substrate to the upper portion of the side surface of each of the outer LED chips mounted on the second unit substrate; and at least one of the plurality of valleys is formed by the first inclined portion and the second inclined portion.

According to one embodiment, each of the light absorbing layers includes valleys formed between the adjacent LED chips in the plurality of pixels.

According to one embodiment, the widths of the valleys between the pixels are preferably larger than those of the valleys between the chips.

According to one embodiment, each of the light absorbing layers is formed by applying a liquid or gel-like material including a black color material to the surface of the corresponding substrate.

According to one embodiment, each of the valleys is formed obliquely from the upper end edge of the side surface of the corresponding LED chip toward the lower end of the valley closest to the surface of the corresponding substrate.

According to one embodiment, the lower end of each of the valleys between the chips is located in the central portion between the two adjacent LED chips.

According to one embodiment, the LED module assembly includes a light absorbing part formed at the interface between the first unit substrate and the second unit substrate.

According to one embodiment, the light absorbing part is formed by spreading a material having a light absorbing color on the side surface of the first unit substrate and the side surface of the second unit substrate in contact with each other.

According to one embodiment, at least one of the plurality of valleys is formed in contact with a light absorbing pattern film previously formed on the first unit substrate or the second unit substrate.

According to one embodiment, the valleys between the chips are formed in contact with a light absorbing pattern film previously formed on the first unit substrate or the second unit substrate.

According to one embodiment, the plurality of LED chips are flip-chip bonded onto the first unit substrate or the second unit substrate.

According to one embodiment, the side surfaces of the first unit substrate and the second unit substrate are vertically cut surfaces.

According to one embodiment, the surface of each of the plurality of LED chips lies at the same level as the upper end of the corresponding valley and is exposed to the outside.

According to one embodiment, the width of the valley formed by the first inclined portion and the second inclined portion at the boundary between the first LED module and the second LED module is preferably the same as the width of the valley formed between the two adjacent pixels on the first substrate or the second substrate.

An LED module assembly according to another aspect of the present invention includes a first LED module and a second LED module wherein the first LED module includes a first unit substrate, a plurality of LED chips mounted on the first unit substrate, and a first light absorbing layer formed on the first unit substrate; the second LED module includes a second unit substrate, a plurality of LED chips mounted on the second unit substrate, and a second light absorbing layer formed on the second unit substrate; the first unit substrate and the second unit substrate are laterally connected to each other; each of the first light absorbing layer and the second light absorbing layer includes a plurality of valleys formed between the plurality of chips; the first light absorbing layer includes a first inclined portion formed obliquely from the upper end edge of the interface between the first unit substrate and the second unit substrate to the upper portion of the side surface of each of the outer LED chips mounted on the first unit substrate; the second light absorbing layer includes a second inclined portion formed obliquely from the upper end edge of the interface between the first unit substrate and the second unit substrate to the upper portion of the side surface of each of the outer LED chips mounted on the second unit substrate; and at least one of the plurality of valleys is formed by the first inclined portion and the second inclined portion meeting each other.

In the LED module assemblies of the present invention including LED modules laterally connected to each other, color interference or diffuse reflection of light at the seams between the LED modules is prevented, achieving a seamless display.

More specifically, light absorbing layers are provided in the form of underfills and include a plurality of valleys between pixels and a plurality of valleys between chips. A valley between pixels is also formed at the seam between the two LED modules to improve seamless characteristics at the seam between the cut surfaces of the LED modules formed by sawing. This valley is previously formed between cut surfaces by sawing, scribing or breaking to prevent diffuse reflection despite the formation of the cut surfaces, contributing to an improvement in luminous efficiency. In contrast, an LED module assembly of the prior art suffers from serious diffuse reflection at cut surfaces of black molded parts formed by sawing.

In addition, a light absorbing material (for example, one including a black color material) is not present on the LED chips of the LED module assemblies according to the present invention, which is effective in increasing the amount of light emitted from the LED chips. Furthermore, a height variation is easier to maintain in the LED module assemblies of the present invention than in an LED module assembly including black molded parts formed by a squeezing process.

Moreover, according to the prior art, defective elements or parts are impossible to repair or correct after the formation of black molded parts by squeezing or transfer molding. In contrast, according to the present invention, only defective elements or parts can be repaired or corrected, resulting in high yield and low production cost.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1:
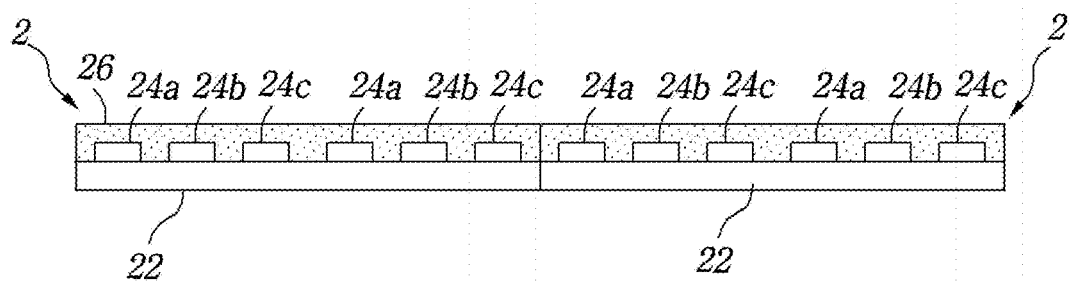
FIG. 1 illustrates an LED module assembly of the prior art.
Figure 2:
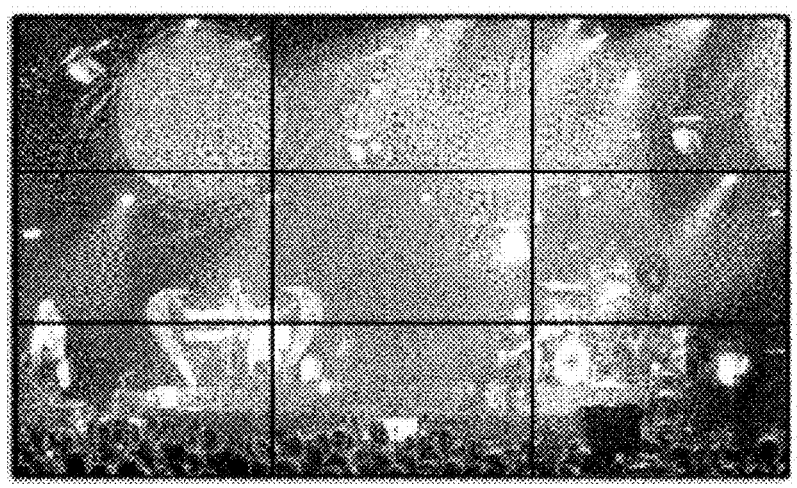
FIG. 2 shows the problems of the LED module assembly illustrated in FIG. 1.
Figure 3:
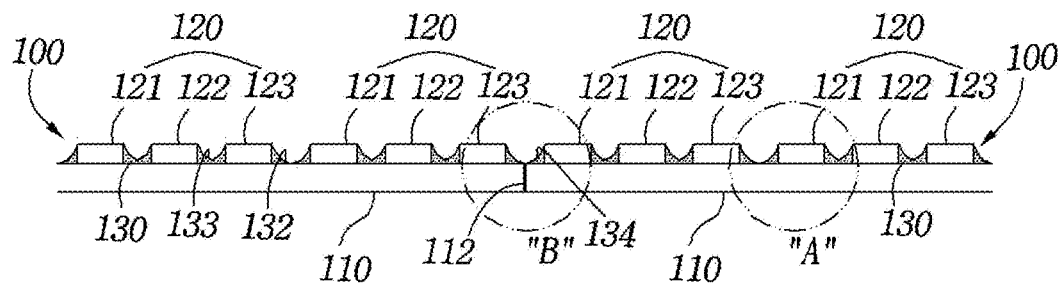
FIG. 3 is a cross-sectional view illustrating an LED module assembly according to one embodiment of the present invention.

Preferred embodiments of the present invention will now be described with reference to the accompanying drawings. The drawings and their description are intended to assist in understanding the present invention to those skilled in the art. Therefore, the drawings and the description should not be construed as limiting the scope of the present invention.

FIGS. 3 to 6 illustrate an LED module assembly according to one embodiment of the present invention.

As illustrated in FIGS. 3 to 6, the LED module assembly includes a plurality of LED modules 100 laterally connected to one another. The plurality of LED modules 100 include a first LED module 100, a second LED module, . . . , and an $n^{th}$ LED module. For convenience of illustration, the first LED module 100 and the second LED module 100 adjacent to each other are selected and denoted by the same reference numeral.

The LED module assembly includes a substrate including a first unit substrate 110 as a part of the first LED module 100 and a second unit substrate 110 as a part of the second LED module 100. The first LED module 100 and the second LED module 100 are laterally connected to each other. Thus, the first unit substrate 110 and the second unit substrate 110 are also laterally connected to each other. The first LED module 100 and the second LED module 100 include a plurality of LED chips 121, 122, and 123 mounted on the first unit substrate 110 and the second unit substrate 110 to form a plurality of pixels 120, respectively. The first LED module 100 and the second LED module 100 include a first light absorbing layer 130 formed on the first unit substrate 110 and a second light absorbing layer 130 formed on the second unit substrate 110, respectively. The unit substrates 110 may be, for example, selected from printed circuit boards (PCBs), flexible substrates (e.g., FBCBs), and transparent organic substrates.

For example, the light absorbing layers 130 may have a black color for light absorption. The light absorbing layers provide a pure black display by other elements of the LED module assembly, which will be explained in more detail, and remove color interference of light from the side surfaces of the LED chips 121, 122, and 123 to improve display image quality. Unlike the black molded parts described in the above-mentioned prior art, the light absorbing layers 130 are not formed on the upper surfaces of the LED chips 121, 122, and 123, causing no substantial decrease in the amount of light emitted from the LED chips. Particularly, the light absorbing layers ensure a seamless display when a display using the LED module assembly is driven.

The first LED module 100 and the second LED module 100 can be produced by singulating an LED module structure (not illustrated) including a substrate (not illustrated) whose size is several times larger than those of the unit substrates and a plurality of LED chips mounted on the substrate. The side surfaces of the first unit substrate 110 and the second unit substrate 110 are vertically cut surfaces. A light absorbing part 112 is formed at the interface between the vertically cut surfaces of the first unit substrate 110 and the second unit substrate 110. The light absorbing part 112 may be formed by spreading a material having a light absorbing color (for example, a black ink) on the side surface of the first unit substrate 110 and the side surface of the second unit substrate 110.

The plurality of pixels 120 are arrayed in a matrix on each of the first unit substrate 110 and the second unit substrate 110. The LED chips 121, 122, and 123, specifically the red LED chips 121, the green LED chips 122, and the blue LED chips 123, are arranged at uniform intervals in the pixels 120. The LED chips 121, 122, and 123 are flip-chip bonded onto the unit substrates 110, thus eliminating the need to form bonding wires thereon. The LED chips 121, 122, and 123 mounted on the unit substrates 110 may be vertical-type LED chips. In this case, bonding wires may be optionally used.

Figure 4:
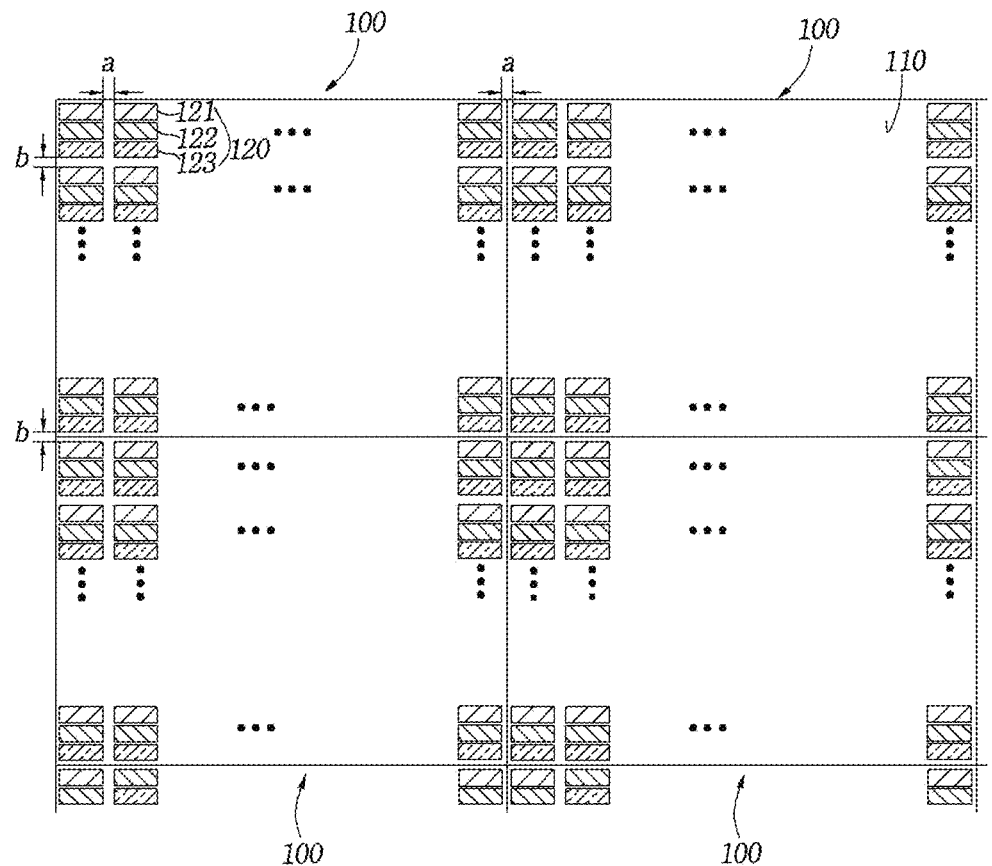
FIG. 4 is a plan view illustrating an LED module assembly according to one embodiment of the present invention.
Figure 5:
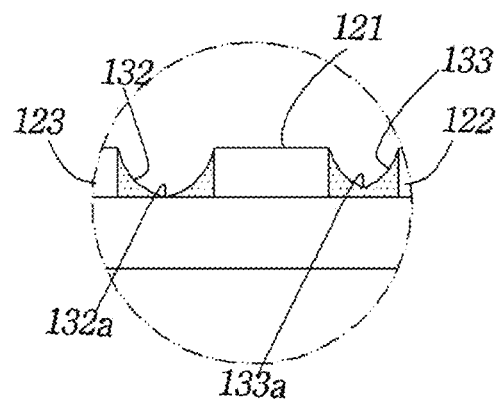
FIG. 5 is an enlarged view of circle "A" of FIG. 3.
Figure 6:
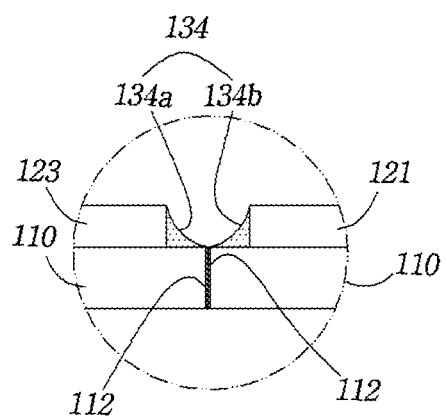
FIG. 6 is an enlarged view of circle "B" of FIG. 3.

FIG. 4 is a plan view illustrating an LED module assembly according to one embodiment of the present invention. The LED module assembly includes a plurality of LED modules 100. In each of the LED modules 100, pixels 120 are arrayed at constant intervals a in the transverse direction and at constant intervals b in the longitudinal direction. In other words, the intervals a between the pixels 120 adjacent to each other in the transverse direction are constant and the intervals b between the pixels 120 adjacent to each other in the longitudinal direction are constant. In a state in which the plurality of LED modules 100 are connected to one another, the interval a between the two pixels adjacent to each other in the transverse direction between the two LED modules 100 and 100 adjacent to each other in the transverse direction is the same as the intervals a between the pixels in the corresponding LED modules. The interval b between the two pixels adjacent each other in the longitudinal direction between the two LED modules 100 and 100 adjacent to each other in the longitudinal direction is the same as the intervals b between the pixels in the corresponding LED modules. Accordingly, the width of a valley formed between the two adjacent LED chips 121 and 121, 122 and 122 or 123 and 123 between the two pixels adjacent to each other in the transverse direction is the same irrespective of whether the two pixels adjacent to each other in the transverse direction are in the same LED module or in the different LED modules adjacent to each other in the transverse direction. The width of a valley formed between the two LED chips 121 and 123 adjacent to each other in the longitudinal direction is the same irrespective of whether the two pixels adjacent to each other in the longitudinal direction are in the same LED module or in the different LED modules adjacent to each other in the longitudinal direction.

Referring again to FIGS. 3 to 6, the first light absorbing layer 130 formed on the first unit substrate 110 and the second light absorbing layer 130 formed on the second unit substrate 110 include a plurality of valleys 132 formed between the plurality of pixels 120. Herein, the valleys 132 are also called "inter-pixel valleys".

Each of the plurality of valleys 132 is formed between the two adjacent LED chips 123 and 121 between the two adjacent pixels. Each of the light absorbing layers includes valleys 133 formed between the adjacent LED chips 121 and 122 or 122 and 123 in the plurality of pixels 120. Herein, the valleys 132 are also called "inter-chip valleys"

The interval between the two adjacent LED chips 123 and 121 between the two adjacent pixels 120 and 120 is larger than the interval between the two adjacent LED chips 121 and 122 or 122 and 123 in each pixel 120. Thus, the width of the valley 132 between the two adjacent pixels 120 and 120 is determined to be larger than the width of the valley 133 formed between the two adjacent LED chips 121 and 122 or 122 and 123 in each pixel 120.

Each of the inter-pixel valleys 132 is formed obliquely from the upper end edge of the side surface of the outer LED chip 121 or 123 in the corresponding pixel toward the lower end 132a of the inter-pixel valley closest to the surface of the first unit substrate 110 or the second unit substrate 110 while being curved slightly. Here, the lower end 132a of each of the inter-pixel valleys 132a may be located in the central portion between the two adjacent LED chips 123 and 121 between the two adjacent pixels 120 and 120. Most preferably, the lower ends 132a of the inter-pixel valleys are substantially in contact with the surface of the first unit substrate 110 or the second unit substrate 110.

Each of the inter-chip valleys 133 is formed obliquely from the upper end edge of the side surface of the LED chip 121, 122 or 123 toward the lower end 133a of the inter-chip valley closest to the surface of the first unit substrate 110 or the second unit substrate 110 while being curved slightly. Here, the lower end 133a of each of the inter-chip valleys 133a may be located in the central portion between the two adjacent LED chips 121 and 122 or 122 and 123 in the corresponding pixel 120. Most preferably, the lower ends 133a of the inter-chip valleys are substantially in contact with the surface of the first unit substrate 110 or the second unit substrate 110.

Here, it is preferable that the inter-pixel valleys 132 are deeper than the inter-chip valleys 133.

Particularly, the first light absorbing layer 130 includes a first inclined portion 134a formed obliquely from the upper end edge of the interface between the first unit substrate 110 and the second unit substrate 110 to the upper portion of the side surface of each of the outer LED chips 121 or 123 in the pixels on the first unit substrate 110. The second light absorbing layer 130 includes a second inclined portion 134b formed obliquely from the upper end edge of the interface between the first unit substrate 110 and the second unit substrate 110 to the upper portion of the side surface of each of the outer LED chips 121 or 123 in the pixels on the second unit substrate 110. The first inclined portion 134a and the second inclined portion 134b are symmetric to each other with respect to the interface and meet each other to form the inter-pixel valleys 134. The inter-pixel valleys 134 are provided between the first unit substrate 110 and the second unit substrate 110 as well as on the first unit substrate 110 and the second unit substrate 110. Preferably, the inter-pixel valleys 134 defined by the first inclined portion 134a of the first light absorbing layer 130 and the second inclined portion 134b of the second light absorbing layer 130 meeting each other have the same shape and the same size as the other inter-pixel valleys 134 of the first light absorbing layer 130 or the second light absorbing layer 130.

The light absorbing layers 130 can be formed by applying a liquid or gel-like resin material including a black color material to the surfaces of the first unit substrate 110 and the second unit substrate 110. The resin material may be applied by a spray technique. The valleys 134 defined by the first inclined portion 134a and the second inclined portion 134b meeting each other are formed obliquely from the upper end edge of the side surface of the corresponding LED chip toward the lower end of the valley closest to the surface of the corresponding substrate. The black color material may be, for example, black carbon.

The liquid or gel-like resin material including the black color material applied to the first unit substrate 110 and the second unit substrate 110 mounted with the plurality of LED chips 121, 122, and 123 by a spray technique is filled between the adjacent pixels and between the LED chips in the pixels to form the light absorbing layers 130. Nevertheless, the liquid or gel-like resin flows down from the upper surfaces of the LED chips 121, 122, and 123 along the side surfaces of the LED chips 121, 122, and 123 due to its surface tension, with the result that the upper surfaces of the LED chips 121, 122, and 123 are exposed to the outside. Thus, the upper surfaces of the LED chips 121, 122, and 123 lie at the same level as the upper ends of the valleys 132 and 133 and are exposed to the outside. Light can be emitted through the upper surfaces of LED chips 121, 122, and 123 on which the light absorbing layers are not found, thus preventing the luminous efficiency of the LED chips from deteriorating.

Figure 7:
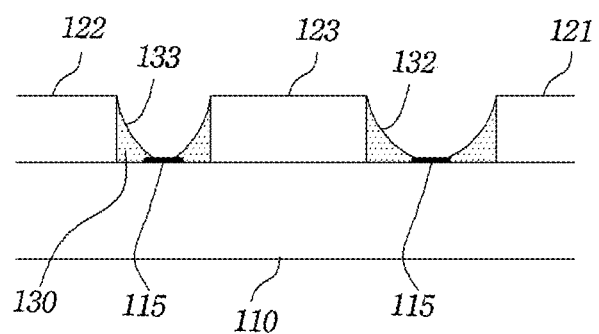
FIG. 7 is a view illustrating a further embodiment of the present invention.

FIG. 7 illustrates an LED module assembly according to another embodiment of the present invention.

Referring to FIG. 7, the LED module assembly includes a substrate, more specifically a first or second unit substrate 110. A light absorbing pattern film 115 is formed on the upper surface of the substrate. The light absorbing pattern film 115 is previously formed such that it covers the exposed surface of the substrate 110 except electrode patterns connected to electrode pads of LED chips 121, 122, and 123. The light absorbing pattern film 115 may be a black photo solder resist (PSR) or a black tape. As in the previous embodiment, a light absorbing layer 130 includes an inter-pixel valley 132 located between the two adjacent LED chips 123 and 121 between two adjacent pixels on the first unit substrate 110 or the second unit substrate 110, an inter-chip valley 133 located between the two LED chips 121 and 122 or 122 and 123 in each of the pixels on the first unit substrate 110 or the second unit substrate 110, and another inter-pixel valley 134 (see FIG. 3) located between the two adjacent LED chips 123 and 121 between the two adjacent pixels between the first unit substrate 110 and the second unit substrate 110. The inter-pixel valleys and inter-chip valley are formed in contact with the light absorbing pattern film 115 at the lower ends thereof. This construction can previously eliminate the possibility that the surfaces of the unit substrates may be exposed through the open lower ends of the valleys and can achieve a uniform black color throughout the LED module assembly.

What is claimed is:

1. An LED module assembly for a display comprising a first LED module and a second LED module wherein the first LED module comprises a first unit substrate, a plurality of LED chips mounted on the first unit substrate to form a plurality of pixels, and a first light absorbing layer formed on the first unit substrate; the second LED module comprises a second unit substrate, a plurality of LED chips mounted on the second unit substrate to form a plurality of pixels, and a second light absorbing layer formed on the second unit substrate; the first unit substrate and the second unit substrate are laterally connected to each other; each of the first light absorbing layer and the second light absorbing layer comprises a plurality of valleys formed between the plurality of pixels; the first light absorbing layer and the second light absorbing layer comprise a first inclined portion and a second inclined portion, respectively; and at least one of the plurality of valleys is formed by the first inclined portion and the second inclined portion, wherein the surface of each of the plurality of LED chips lies at the same level as the upper end of the corresponding valley and is exposed to the outside.

2. The LED module assembly according to claim 1, wherein each of the light absorbing layers comprises valleys formed between the adjacent LED chips in the plurality of pixels.

3. The LED module assembly according to claim 2, wherein the widths of the valleys between the pixels are larger than those of the valleys between the chips.

4. The LED module assembly according to claim 1, wherein each of the light absorbing layers is formed by applying a liquid or gel-like material comprising a black color material to the surface of the corresponding substrate.

5. The LED module assembly according to claim 1, wherein each of the valleys is formed obliquely from the upper end edge of the side surface of the corresponding LED chip toward the lower end of the valley closest to the surface of the corresponding substrate.

6. The LED module assembly according to claim 5, wherein the lower end of each of the valleys between the chips is located in the central portion between the two adjacent LED chips.

7. The LED module assembly according to claim 1, wherein the LED module assembly comprises a light absorbing part formed at the interface between the first unit substrate and the second unit substrate.

8. The LED module assembly according to claim 1, wherein the light absorbing part is formed by spreading a material having a light absorbing color on the side surface of the first unit substrate and the side surface of the second unit substrate in contact with each other.

9. The LED module assembly according to claim 1, wherein at least one of the plurality of valleys is formed in contact with a light absorbing pattern film previously formed on the first unit substrate or the second unit substrate.

10. The LED module assembly according to claim 2, wherein the valleys between the chips are formed in contact with a light absorbing pattern film previously formed on the first unit substrate or the second unit substrate.

11. The LED module assembly according to claim 1, wherein the plurality of LED chips are flip-chip bonded onto the first unit substrate or the second unit substrate.

12. The LED module assembly according to claim 1, wherein the side surfaces of the first unit substrate and the second unit substrate are vertically cut surfaces.

13. The LED module assembly according to claim 1, wherein the width of the valley formed by the first inclined portion and the second inclined portion at the boundary between the first LED module and the second LED module is the same as the width of the valley formed between the two adjacent pixels on the first substrate or the second substrate.

14. An LED module assembly comprising a first LED module and a second LED module wherein the first LED module comprises a first unit substrate, a plurality of LED chips mounted on the first unit substrate, and a first light absorbing layer formed on the first unit substrate; the second LED module comprises a second unit substrate, a plurality of LED chips mounted on the second unit substrate, and a second light absorbing layer formed on the second unit substrate; the first unit substrate and the second unit substrate are laterally connected to each other; each of the first light absorbing layer and the second light absorbing layer comprises a plurality of valleys formed between the plurality of chips; the first light absorbing layer comprises a first inclined portion formed obliquely from the upper end edge of the interface between the first unit substrate and the second unit substrate to the upper portion of the side surface of each of the outer LED chips mounted on the first unit substrate; the second light absorbing layer comprises a second inclined portion formed obliquely from the upper end edge of the interface between the first unit substrate and the second unit substrate to the upper portion of the side surface of each of the outer LED chips mounted on the second unit substrate; and at least one of the plurality of valleys is formed by the first inclined portion and the second inclined portion meeting each other.

* * * * *